United States Patent [19]

Hormel

[11] Patent Number: 4,677,754
[45] Date of Patent: Jul. 7, 1987

[54] MULTIPLEXING OF A BANDPASS FILTER CIRCUIT TO WORK WITH A FLUX-GATE SENSOR OUTPUT

[75] Inventor: Ronald F. Hormel, Mount Clemens, Mich.

[73] Assignee: Chrysler Motors Corporation, Highland Park, Mich.

[21] Appl. No.: 814,125

[22] Filed: Dec. 27, 1985

[51] Int. Cl.⁴ .................. G01R 33/02; G01C 17/30
[52] U.S. Cl. .................................... 33/361; 33/356; 33/363 Q
[58] Field of Search .............. 33/361, 356, 357, 363 Q

[56] References Cited

U.S. PATENT DOCUMENTS

| 4,262,427 | 4/1981 | Lynch et al. | 33/361 |
| 4,555,761 | 11/1985 | Matsumoto et al. | 33/361 |
| 4,611,171 | 9/1986 | Woods | 33/361 |

Primary Examiner—Willis Little
Attorney, Agent, or Firm—Mark P. Calcaterra

[57] ABSTRACT

Multiplexing a bandpass filter circuit to work with a flux-gate sensor output to minimize the amount of electronic circuitry required to work with the control system and to reduce the effect of gain on the circuit by emphasizing repeatability.

1 Claim, 12 Drawing Figures

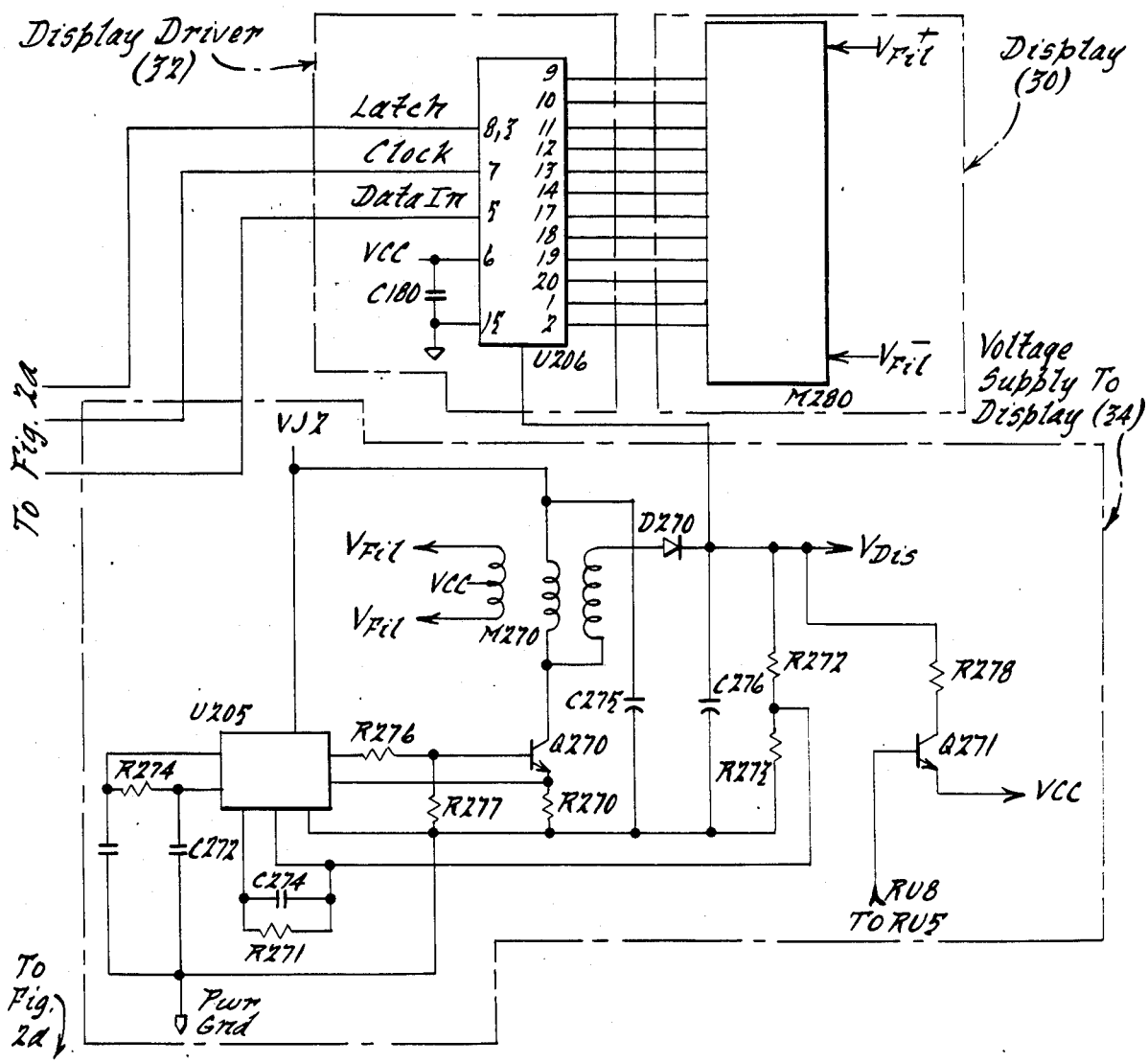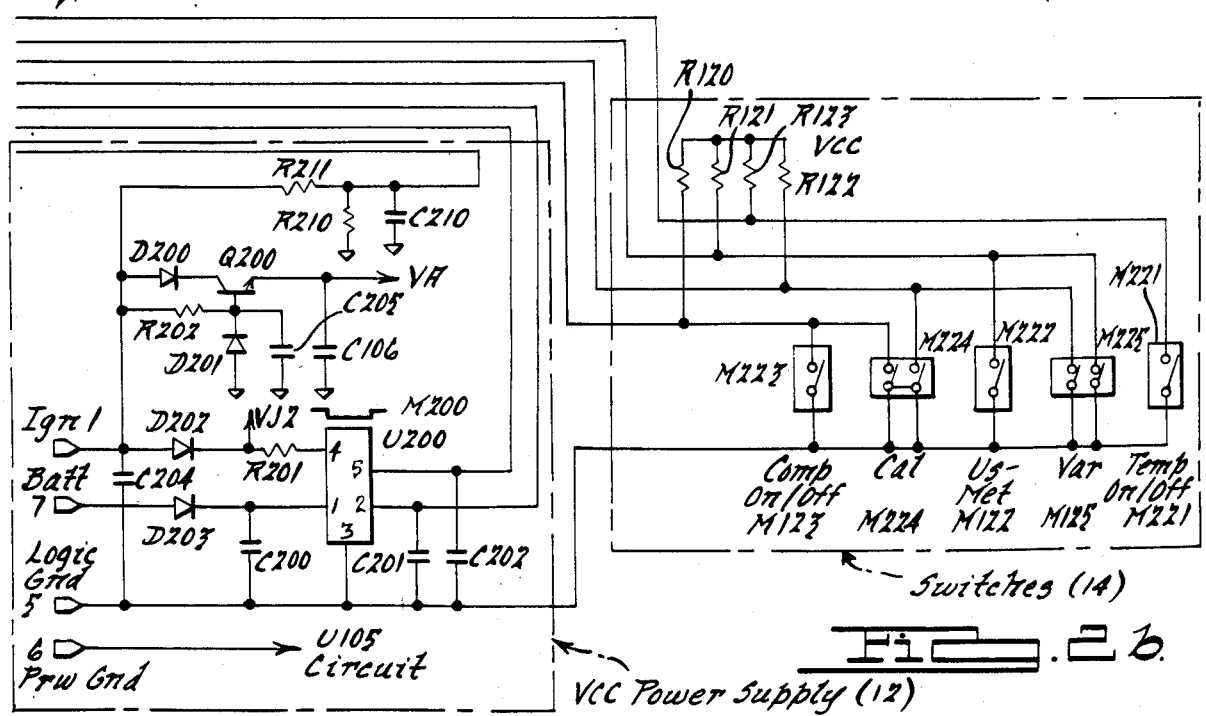
FIG. 2b

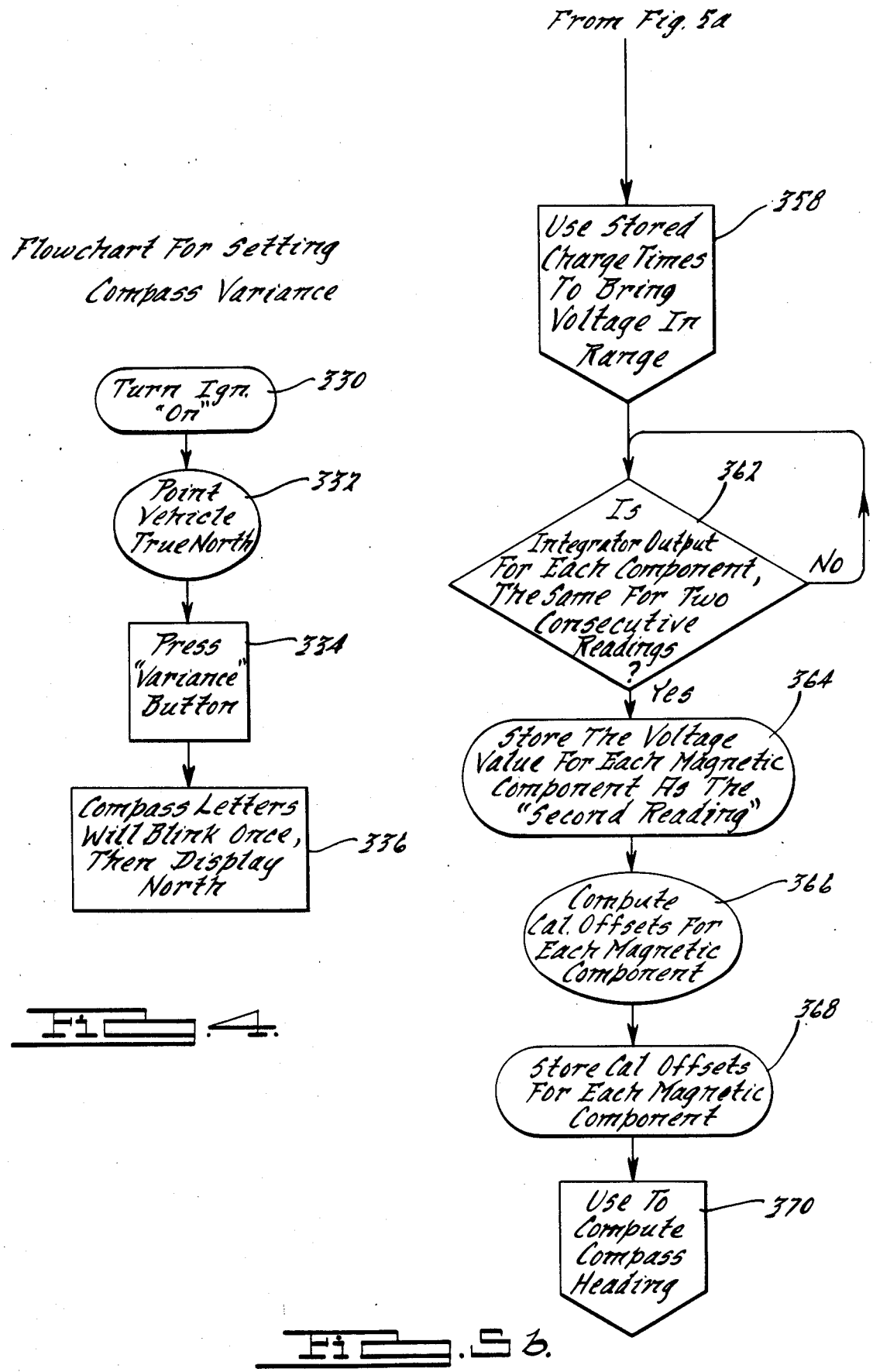

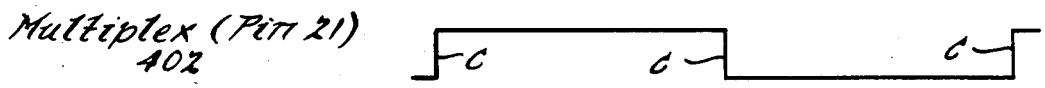
FIG. 7.
FIG. 8.

MULTIPLEXING OF A BANDPASS FILTER CIRCUIT TO WORK WITH A FLUX-GATE SENSOR OUTPUT

BACKGROUND AND SUMMARY OF THE INVENTION

This invention relates generally to the field of electronically controlled compasses for use in an automobile. More specifically, it relates to the type of electronic compass which employs a flux-gate sensor similar to the type described in the article by Garner entitled "A Magnetic Heading Reference For The Electro Fluidic Auto Pilot" which appeared in two parts, one in the November 1981, and one in the December 1981 issues of *Sport Aviation* and are hereby incorporated by reference.

The theory on operation of flux-gate magnetic field sensors in an automotive application is further described in an article entitled "Magnetic Field Sensor And Its Application To Automobiles" by Hisatsugu Itoh dated February, 1980 and published by the Society of Automotive Engineers as "Paper No. 800123." This reference is also hereby incorporated by reference.

Further examples of work in the area of electronic compasses appears in the following U.S. Pat. Nos.: 3,943,763 issued Mar. 16, 1976 to Howell D. Garner entitled "Magnetic Heading Reference"; 4,424,631 issued Jan. 10, 1984 to Franks entitled "Electrical Compass"; 4,425,717 issued Jan. 17, 1984 to Marcus entitled "Vehicle Magnetic Sensor"; 4,505,054 issued Mar. 19, 1985 to Clark et al. entitled "Magnetic Sensor Mounting System"; and 4,546,551 issued Oct. 15, 1985 to Franks entitled "Electrical Control System."

The U.S. Pat. No. 3,943,763 to Garner describes an electrically compensated magnetometer (A magnetometer's function is to detect magnetic fields and to measure their magnitude and direction.) It provides a means for compensating for the northerly turning error in a magnetometer used as a heading reference for a vehicle such as an aircraft. Northerly turning error is described in "A Magnetic Heading Reference For the Electro Fluidic Auto Pilot", the articles cited above. Basically it arises from the fact that the earth's magnetic field is not horizontal except for a few locations. The lines of magnetic flux in the United States are between 60 to 75 degrees from the horizontal. This, according to Garner's *Sport Aviation* articles, is the dip angle.

The U.S. Pat. No. 4,424,631 to Franks describes a circuit to work with an electrical compass. It features an oscillator coupled to a digital bandpass filter and a synchronous phase detector in such a way that the frequency and phase of output signals from a flux-gate sensor have a predetermined relationship to the excitation signal. According to Franks, this results in a tuning free design since the same oscillator signal is presented to excite the flux-gate sensor.

The U.S. Pat. No. 4,425,717 to Marcus describes a flux-gate sensor mounting structure for an electrical compass in a vehicle. According to Marcus, the location of the sensor in association with the rearview mirror somewhat isolates the sensor from the metallic mass of the vehicle and from the vehicle's wiring.

The U.S. Pat. No. 4,505,054 to Clark et al. describes another mounting system for a flux-gate sensor. According to Clark et al., this mounting structure includes a cradle for pivotally mounting the sensor for adjustable movement in a vertical plane aligned with the longitudinal axis of a vehicle.

The U.S. Pat. No. 4,546,551 also to Franks describes an electrical control system, including a microcomputer for correction control of an electrical compass. The correction signal is applied directly to the sensor windings to drive the sensor output signal to the desired level. Northerly turning error is corrected via a signal processing procedure which affects the display output signals based on stored variation correction angle information.

An object of the present invention is to improve the systems of the prior art by supplying a simplified calibration technique utilizing the combination of software and hardware; the hardware being used to operate with voltage levels in required ranges and the software used to perform the precise calibration.

Another object of the present invention is to multiplex a bandpass filter circuit to work with the flux-gate sensor output to minimize the amount of electronic circuitry required to work with the control system and to reduce the effect of gain on the circuit. This is done by emphasizing repeatability.

A further object of the present invention is to provide an auto-ranging circuit to bring a calibration voltage into a narrow range to allow more precise compass calibration by means of software. This circuit also eliminates the need for an analog potentiometer and the associated calibration adjustments.

Still another object of the subject invention is to present a digital filter for smoothing out the magnetic field components prior to directional computation.

Yet another object of the present invention is to provide a microcomputer controlled quick ranging technique to quickly bring a voltage into a desired calibration range.

This application is one of three applications all filed on the same day and all commonly assigned having similar specifications and drawings; the three applications being identified below:

| U.S. Serial Number | Title | Inventor |
| --- | --- | --- |
| 813,897 | Simplified Calibration Technique And Auto Ranging Circuit For An Electronic Compass Control Circuit | Ronald F. Hormel |
| 814,125 | The Multiplexing Of A Bandpass Filter Circuit To Work With A Flux-Gate Sensor Output | Ronald F. Hormel |
| 814,133 | Microcomputer Controlled Quick Ranging Technique and Digital Filter | William V. Luitje |

DESCRIPTION OF THE DRAWINGS

Other objects, features and advantages of the present invention will become more fully apparent from the following detailed description of the preferred embodiment, the appended claims and in the accompanying drawings in which:

FIG. 2b is the continued schematic diagram of the electronic compass circuitry;

FIG. 4 is a flowchart for setting the compass variance;

FIG. 5b is a continuated flowchart of the calibration/ranging procedure;

FIG. 7 is a timing diagram illustrating the signals at the integrator output, ranging circuit, ranging control pin and multiplex circuit;

FIG. 8 is a timing diagram of the synchronous detector signal and the coil driver signal;

DETAILED DESCRIPTION OF THE PREFERRED EMBODIMENT

Figure 1:
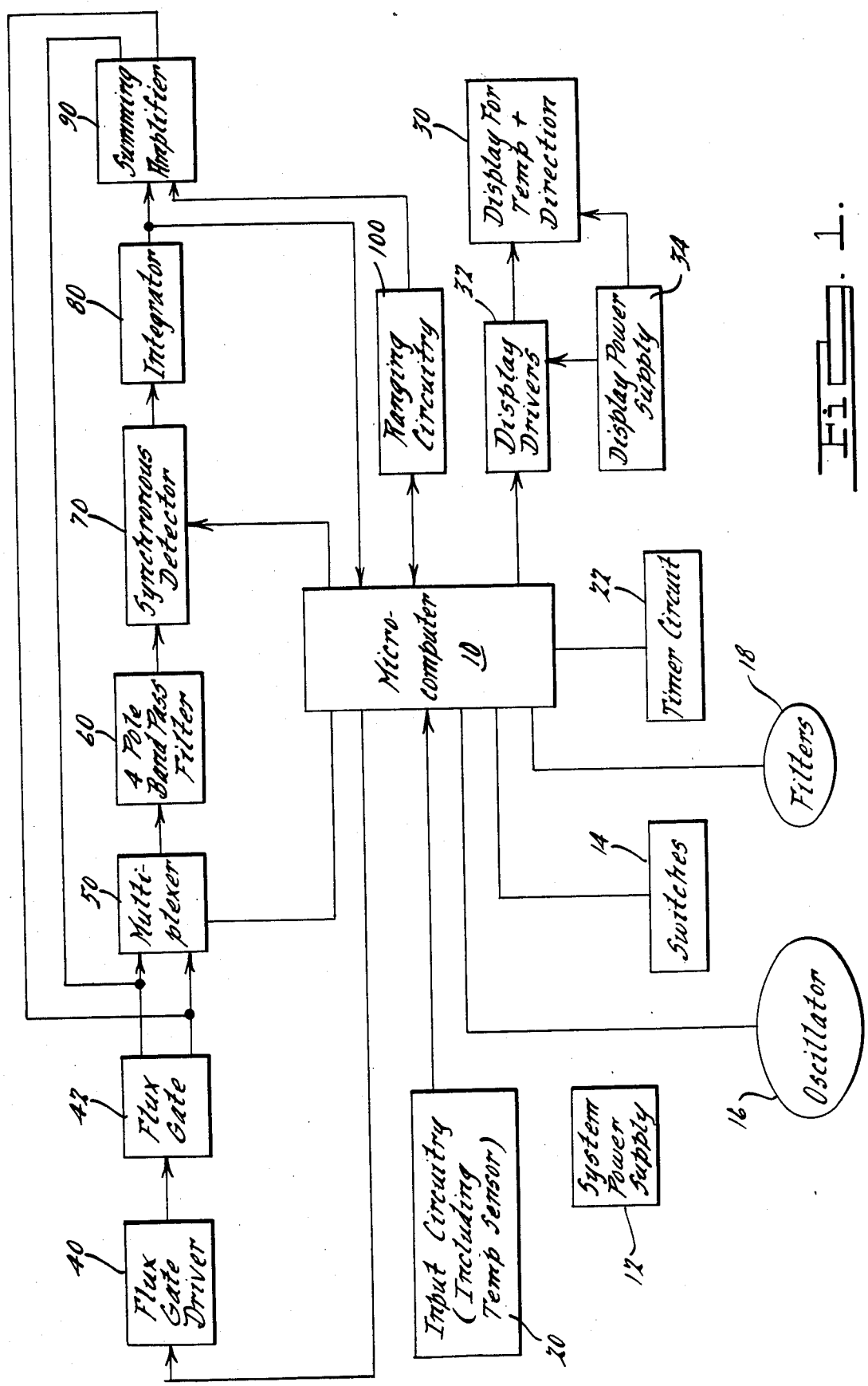
FIG. 1 is a block diagram of the electronic compass control hardware.

Referring to FIG. 1, illustrated is a block diagram of the electronic compass. The heart of the system is a microcomputer 10 which interfaces with almost every other component shown in the diagram. The microcomputer 10 receives its power through power supply 12 as does many of the other components on the figure. Therefore, the power supply 12 is not connected to any of the diagrams at any of the components on FIG. 1 to keep the diagram less cluttered.

Switches 14 are provided to work with the microcomputer and allow the operator of an automotive vehicle equipped with an electronic compass to communicate with the microcomputer 10. Oscillator 16 generates a signal which the microcomputer 10 uses for timing and for signal processing. Capacitors 18 are used as resets and filters throughout the circuit and are diagrammatically shown as being connected to microcomputer 10. Their function is to dampen out noise and to provide some signal conditioning where necessary. The switches 14 function to allow the driver to calibrate the system, make manual inputs for the directional variations, engage or disengage a temperature reading, engage or disengage the compass and/or to display the results in U.S. or metric units.

The input circuitry 20 is in communication with the microcomputer 10 and consists of components to control the intensity of the display 30 and also the reading of the thermister type temperature sensor.

The timer circuit 22 exists to account for the possibility that the vehicle will be restarted before the temperature of the engine drops to the ambient temperature period. Under that circumstance, without the timer, the thermister temperature sensor would sense a higher ambient temperature due to the temperature radiating from the engine instead of the actual ambient temperature. The one hour timer 22 retains the last-sensed ambient temperature to allow the engine to return to ambient temperature. The specification on the one hour timer is plus or minus 15 minutes.

The display 30 is controlled by the microcomputer 10 and provides a visual readout of the output generated by the electronic compass circuit and that generated by the temperature sensor shown in FIG. 1. This display is then read by the operator of the automobile to show him or her the direction the vehicle is traveling in. The display 30 is driven by display drivers 32 and the display power supply 34. The display power supply 34 uses transformers made specifically for this application. Many of the components are standard off-the-shelf integrated circuits and power supply chips. The display power supply 34 acts as a constant frequency switching regulator.

The microcomputer 10 also works in conjunction with a flux-gate driver 40 and flux-gate 42. The flux-gate operation can best be described in referring to the document entitled "A Magnetic Heading Reference For The Electro Fluidic Auto Pilot" referred to in the Background and Summary of the Invention and hereby incorporated by reference.

The flux-gate driver 40 takes a square wave signal from the microprocessor or microcomputer 10 and adds enough drive to it to saturate the flux-gate 42. This operation is again explained in the documents incorporated by reference, namely "A Magnetic Heading Reference For The Electro Fluidic Auto Pilot" and "Magnetic Field Sensor And Its Application To Automobiles (SAE Paper No. 800123)" hereby incorporated by reference.

The flux-gate communicates with multiplexer 50. The multiplexer 50 is also in communication with microcomputer 10. The multiplexer 50 in communication with a four pole bandpass filter 60 which feeds the filtered signal to a synchronous detector 70.

Feedback from the synchronous detector 70 works to stabilize the entire compass control system shown in FIG. 1 by feeding back a portion of its current through integrator 80 and summing amplifier 90 to the flux-gate 42. The fed back current eventually becomes an equal and opposite signal versus that produced by the flux-gate 42 as the flux-gate 42 senses the magnetic field.

More specifically, the output of the bandpass filter 60, which is fed into the gate switch 102C (shown in FIG. 2a) and then to the integrator 80, is a sinusoidal signal.

The sinusoid is fed into the gate switch 102C which is pulsed on and off at the same frequency controlled by the microcomputer 10. The resultant output of the gate switch sensor is a half wave rectified signal fed into the integrator 80.

The output of the integrator 80 is a D.C. level. When the sensed magnetic field of the earth produces a signal at the flux-gate 42, it is filtered through the bandpass filter 60 and synchronous detector 70. Thus, it is positive half wave rectified after exiting the gate-switch 102C. The output of the integrator 80 will gravitate downward to balance the inputs on 103C. This output is fed back through the summing amplifier 90 to the flux-gate 42 to adjust the current to the coils up or down and, therefore, the signal presented to the bandpass 60 filter which stabilizes the D.C. level and the output of the integrator 80.

Likewise, if the input to the integrator 80 is a negative half wave rectified signal from the bandpass filter 60 and gate-switch 102C, the output of the integrator 80 will rise to equalize the inputs. This raised output will be fed back to the flux-gate coils in 42 through the summing amplifier 90 thereby adjusting the signal presented to the bandpass filter 60, likewise preserving the stability of the system.

To further amplify the description of the flux-gate 42, it should be understood that the desire is to measure the earth's magnetic field which is a difficult thing to accomplish. Therefore, the desire is to merely sense the signal produced in a coil by the earth's magnetic field and to produce an equal and opposite image of that sensed signal in the same coil by a D.C. current.

In other words, when the north-south gate switch is closed, the signal produced by the north-south component of the earth's magnetic field in the flux-gate coil is balanced with the current generated in the feedback path. Likewise, when the east-west gate switch is closed, the signal produced by the east-west component of the earth's magnetic field in the flux-gate coil is balanced with the current generated in the feedback path from the summing amplifier through resistor 149.

The current produced in the feedback path and fed through resistors 149 and 148 opposes the current generated in the coils as produced by the earth's magnetic field.

The second order harmonic signal from the four pole bandpass filter 60 is presented to the synchronous detector 70. The function of the synchronous detector 70 is to select the portion of the second harmonic to be integrated by integrator 80. The output of the integrator 80 is a DC signal which is fed back through a summing amplifier 90 to the secondary coil of flux-gate 42 at pins 3, 4, 5 and 6. This has the effect of cancelling out the input to the four pole bandpass filter. This provides stability to the system.

The summing amplifier 90 also compares the output of ranging circuit 100 to that of the integrator 80. The signal is fed back to the input of the multiplexer 50 to stabilize the system. The stabilization effect is applied to both of the flux-gate sensor outputs.

The ranging circuitry 100 interfaces with the microcomputer 10 in a way which will be described below.

Figure 2A:
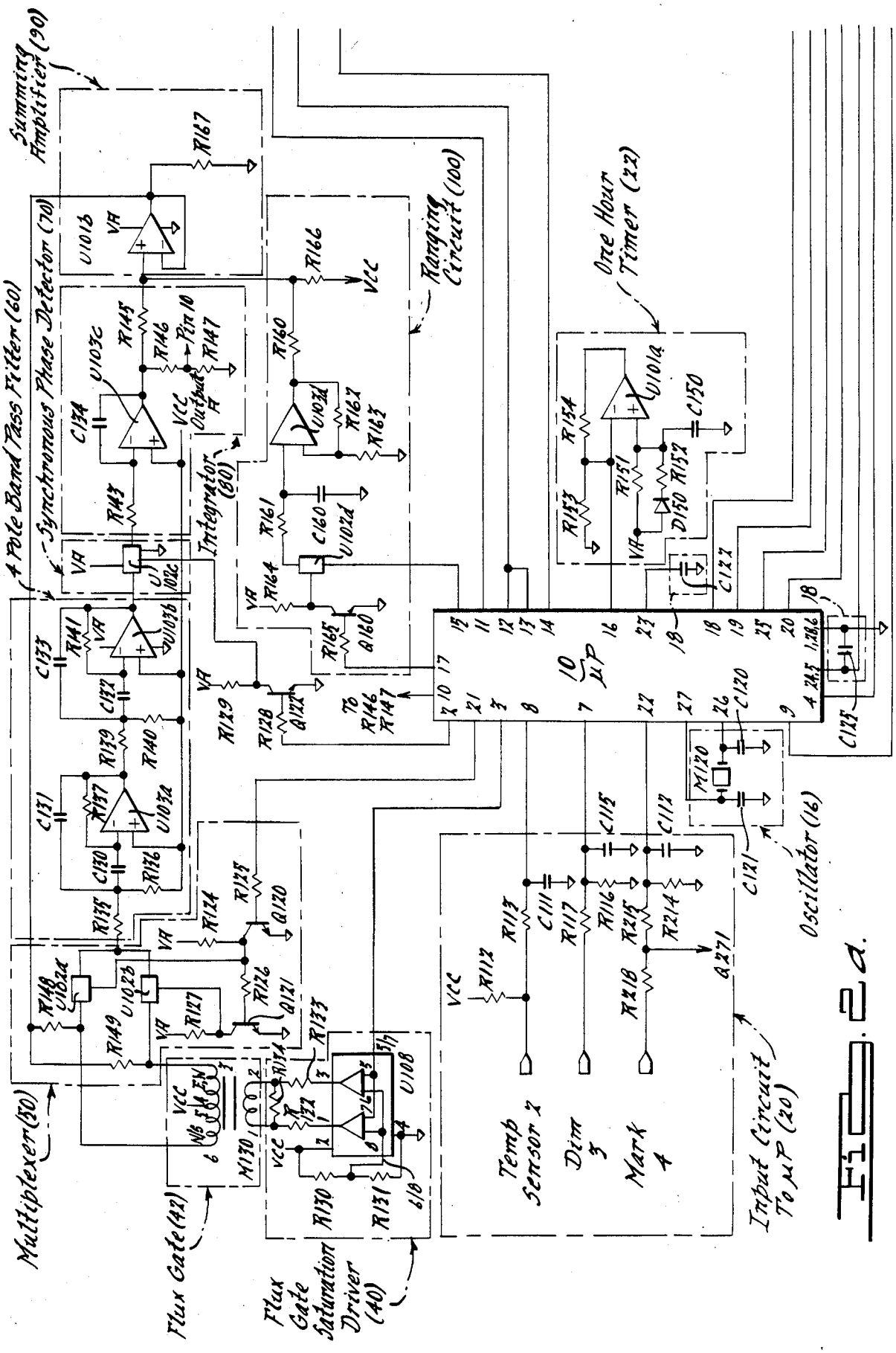
FIG. 2a is a schematic diagram of the electronic compass circuitry.

Referring now to FIG. 2a and FIG. 2b, the details of the circuit described in the block diagram of FIG. 1 are provided.

Microcomputer 10 is an off-the-shelf commercially available microprocessor with the Commercial Part Number MC6805S2.

The $V_{CC}$ power supply 12 provides power to the various components throughout the FIG. 2a and FIG. 2b. The $V_{CC}$ power supply 12 supplies 5 and 10 volts to the rest of the system described and as shown in FIG. 2a and FIG. 2b. The heart of the five-volt section of the $V_{CC}$ power supply is a regulator chip U-200 which accepts an input voltage from the battery through diode D-203 and coupled to logical ground to capacitor C-200 into pin 1 of U-200. Also, as an input to regulator U-200 is the ignition voltage IGN1 presented to the switch-reset pin 4 of regulator 200 through diode D-202 and resistor R-201. Voltage VJ2 is available as the protected switched battery voltage between diode D-202 and resistor R-201.

The regulator U-200 is provided with a heat sink M-200. The regulator U-200 is grounded through pin 3 to logic ground. The output of regulator U-200 comes from pin 2 and is partially maintained by capacitor C-201. For this particular application, the output on pin 2 of regulator U-200 is five volts at approximately 750 milliamps. Also available from regulator 200 is a standby five volt output voltage offered at pin 5 and coupled to logical ground with capacitor C-202. The stand-by five volt output is available at 10 milliamps.

Also provided in the $V_{CC}$ power supply is a ten volt section with an output of voltage $V_A$ from transistor Q-200. Diodes D-200 and D-201, along with resistor 202 and capacitors C-205 and C-106 work with transistor Q-200 to generate this ten volt output as shown in the schematic.

Also available is another voltage taken from the ignition voltage and divided down through resistor divider network R-211 and R-210 and supported by capacitor C-210. The purpose of this circuit is to indirectly measure the ignition voltage in the control dimming of the displays. This is an indirect measure of the ratio of display panel voltage changes. The ignition voltage is measured indirectly across resistor R-210. The ratio of the voltage across resistor R-210 to the voltage across the series connected resistors R-211 and R-210 remains the same. Therefore, ignition voltage can always be computed in microcomputer 10 by monitoring the voltage across R-210 and using it to compute the ignition voltage in the ratiometric relationship stored in microcomputer 10.

The ignition voltage is then used to coordinate the dimming of the display 30 after taking note of the signal presented to the A/D converter on pin 7 of microcomputer 10. This signal is generated by the operator turning the potentiometer switch connected at DIM 3 as modified by resistor divider R117 and R116 and supported by capacitor C115. The microcomputer adjusts the dimming signal given to the display driver 32 as a function of the indirectly measured ignition voltage presented to pin 9 of microcomputer 10.

Also providing inputs to the system shown in FIG. 2a and FIG. 2b is the switching section 14. The switching section 14 comprises switching elements M221-M225, all of the switches operate in the same fashion, being connected between logic ground and a pull-up resistor connected to $V_{CC}$. Some of the switches are double pole. $V_{CC}$ is connected to each of resistors R-120, R-121, R-122 and R-123 which, in turn, are connected to the various switches M-221 through M-225. The junction between the switches and the resistors are fed to various pins on the microcomputer 10 and the microcomputer 10 senses when these points are tied to logic ground by means of an operator action to close any of the switches M-221 through M-225. The switches allow the vehicle's operator to select a temperature function on M-221, a variance function on switch 225, a U.S.-metric function on M-222, a calibration function on switch 224, and a compensation function on switch M-223.

Oscillator section 16 provides crystal oscillator M-120 and capacitors C-120 and C-121 and presents a oscillator signal to the clock inputs of the microcomputer 10.

Filter section 18 comprising reset capacitor C-122 connected to pin 23 of microcomputer 10 and filter capacitor C-125 connected between tied pins 5,24 and tied pins 1,6,28 are provided for resetting and filtering purposes.

The input circuitry section 20 presents inputs to pins 8, 7 and 22 of microcomputer 10. When Mark-4 is high, dimming takes place according to dim voltage and ignition voltage read as described on page 9. Mark-4 is high when lights are high (unless overridden by detents).

The input circuitry 20 consists of several components which control the intensity of the display 30 and also the reading of a thermister-type temperature transducer (not shown), but connected to Temp Sensor 2 through to pin 8 of microcomputer 10.

Timer circuitry 22 presents a signal to pin 16 of the microcomputer 10 which is 1 bit of an input port of microcomputer 10. The timer 22 exists to account for the possibility that the vehicle will be restarted before the engine temperature drops to the ambient temperature. Under that circumstance, without the timer, the thermister temperature sensor would sense a higher ambient temperature due to the temperature radiating from the engine instead of the actual ambient temperature. The one-hour timer signals the software in microcomputer 10 to retain the last sensed ambient temperature until the sensor returns to ambient temperature. The specification on the timer is on hour ±15 minutes. The timer is of conventional design and consists of a power operational amplifier U-101a. Voltage $V_A$ from power supply 12 is presented to the non-inverting input of U-101a through a parallel circuit made up of resistor 151 as one branch and parallel with diode 150 in series with resistor 152 in the other branch. Also connected to the non-inverting input of view U-101a is capacitor C-150 which is connected between the non-inverting input of U-101a and ground. On the inverting input to U-101a, a resistor divider network made up of resistor R-154 and resistor R-153 is connected between the output of U-101a and ground. The resistor divider point between R-153 and R-154 is connected to the inverting input which, in turn, is connected to pin 16 of the microcomputer 10.

The display section 30 is made up of a vacuum fluorescent display M-280. $V_{FIL+}$ and $V_{FIL-}$ are supplied by power supply 12. The filament becomes red hot when so supplied with voltage. The excitation of the filament causes electrons to be boiled off the filament wires.

Next to the filament wires in the display 30 are grids which are elevated to a positive D.C. voltage. Anodes are also provided. The grids are sandwiched between the anodes and the filament wires. There is an anode for each segment of a digital character or number that can be displayed. The grids define the area of each character.

When electrons are boiled off the filament, they accelerate toward the oppositely charged grid. The anodes selected for display are supplied with the same positive voltage as the grid.

The electrons will pass through the grid and will accumulate on the grid in the areas close to positively charged anodes creating high current in the grid and low current in the excited anode. The desired character is displayed based on the grid and anode excited. This is controlled by microcomputer 10 as each grid and anode can be addressed for excitation.

The display driver section 32 is made up of a vacuum fluorescent display driver U-206. Functionally, the display driver U-206 contains gates for a latch enable signal on pin 8 and a gate for a strobe signal on pin 3. A clock signal is accepted on pin 7 through a gate and the data can be presented to the display driver on pin 5 through a gate. The clock and data inputs are fed into a 12-bit static shift register which, in turn, operate with a bank of 12 latches as enabled by the latch enable gate on pin 8. The strobe signal on pin 3 further enables 8 output and gates when the strobe signal is present at the same time as one of the corresponding latch signals from the latch bank. A serial output is also provided from the 12-bit static shift register. The outputs of U-206 are fed to the display M-280 from the output pin 9, 10, 11, 12, 13, 14, 17, 18, 19, 20, 1 and 2. The latch signal is presented to pins 8 and 3 which are tied together from pin 11 of the microcomputer 10. This is a data control register of the microcomputer 10. The clock input to the display driver U-206 is presented on pin 7 from pin 12 (which is tied to pin 13) of microcomputer 10. Pins 12 and 13 are also data control register outputs from the microcomputer 10. The data in from the microcomputer pin 14, also a data control register output for microcomputer 10 is presented to the display driver U-206 on pin 5. The $V_{CC}$ supply from $V_{CC}$ voltage supply 12 is presented to pin 6 and the power ground is presented to pin 15 of U-206. The pins 6 and 15 are coupled by way of a capacitor C-180. The display 30 is a vacuum fluorescent type of blue-green in color. It is multiplexed to minimize the number of pins required in the design. Since it is multiplexed, the grids on the display are excited at a minimum rate of 125 Hz. This minimum rate exists so that the vehicle's driver cannot detect the pulsating of the various grids on the display 30.

The anodes of the display 30 take the form of the letters "N", "S", "E", "W", "NE", "NW", "SE" and "SW" that represent the various directions that the vehicle is headed. A different grid exists to display the outside temperature. It operates in a similar fashion. This set of anodes will also display numeric data.

The 12-bit display drivers 32 are an off-the-shelf component. However, the vacuum fluorescent display is customized and made specifically for this application.

The display voltage supply 34 to the display driver section 32 is centered around the integrated circuit U-205 which is an off-line current mode pulse width modulator controller.

The display power supply has an output of 43 volts. The transformers are represented as M-270 and are wound specifically for this application. The rest of the components, including the integrated circuit U-205, are off-the-shelf components. The power supply chip U-205 acts as a constant frequency switching regulator.

The flux-gate saturation driver 40 comprises a dual power operational amplifier U-108 which takes a square wave signal from the microprocessor 10 as presented from the microprocessors pin 3 (a timer output) and adds enough drive to it to saturate the flux-gate 40. This is accomplished by way of the resistor divider network R-130 and R-131 to provide a reference voltage to U-108 between pins 2 and 4, pin 2 being designed to accept the $V_{CC}$ voltage and pin 4 being designed to accept power ground level. The outputs of the dual power operational amplifiers are tied to resistors R-132 and R-133, respectively, from pins 1 and 3 of U-108. Pins 5 and 7 (the inverting input of one operational amplifier and the non-inverting input of the other) are tied together and receive the square wave signal from microcomputer 20 from its pin 3. The remaining non-inverting or one operational amplifier and the inverting input of the other on pin 6 and 8 are tied together and connected to the juncture between resistors R-130 and R-131.

The operational amplifiers in U-108 are used as comparators and are toggled back and forth for different comparator configurations.

The flux-gate driver 40 supplies a saturation current to flux-gate 42. Flux-gate 42 is represented as transformer M-130 in FIG. 2a. The flux-gate saturation driver 40 is connected to the primary coil of the flux-gate transformer M-130 (pins 1 and 2) across resistor R-134. The secondary of the flux-gate transformer M-130 is provided with a center tab to which voltage $V_{CC}$ is supplied. Between the pins 3, 4 and the secondary of the coil M-130 is the east/west flux-gate coil, and between the pins 5 and 6 of the secondary of coil M-130 is the flux-gate for the north/south direction. $V_{CC}$ is connected between the combined junction of pins 4 and 5 on M-130 and ground.

The secondary of the flux-gate coil M-130 is connected at its pins 3 and 6 to the multiplexer 50.

Multiplexer 50 works with a switching network built around transistors Q-120 and Q-121. The switching network takes a signal from pin 21 of the microcomputer 10 and alternates the signal levels from the output of Q-120 and Q-121 such that the signal from the collectors of Q-120 and Q-121 are fed to a bi-directional switch gates represented as U-102a and U-102b. When one of the bi-directional switches U-102a or U-102b is gated to a conducting position by the control signals from Q-120 or Q-121 and its associated biasing networks of resistors R-124, R-125, R-126 and R-127 as supplied with voltage from $V_A$, the output of the flux-gate transformer M-130 is allowed to pass to the next section that being four pole bandpass filter 60. The pins 3 and 6 from the secondary of the flux-gate coil M-130 are presented to the bi-directional switches U-102a and U-102b. Feedback resistors R-148 and R-149 allow for the communication of the output of summing amplifier 90 to be fed back to the output of the flux-gate transformer M-130 at the input to bi-directional switches U-102a and U-102b.

The four pole bandpass filter 60 consists of a bandpass filter of conventional design for sensing the north/south coil of transformer M-130 or the east/west coil of transformer M-130. The bandpass filter 60 filters out all but the second harmonic of the drive signal as reflected through the flux-gate 42. The same harmonic is generated due to the earth's magnetic field. The amplitude of the N/S and E/W signal at the output of bandpass filter 60 coupled through the synchronous detector 70 represents the magnetic field strength at the vehicle's location.

More specifically, the output of multiplexer 50 is fed to a two-stage operational amplifier bandpass filter of conventional design and is shown substantially in FIG. 2a.

The output of the bandpass filter 60 is fed to a synchronous or phase detector 70 which consists of a bi-directional switch just like the ones used in the multiplexer 50. The second order harmonic signal from the output of the bandpass filter 60 is presented to the phase detector 70. The function of the phase detector 70 is to select the portion of the second harmonic that is to be integrated in the integrator 80. The bi-directional switch U-102c represents the synchronous or phase detector 70 and it is controlled by a switching network controlled by a transistor Q-122 and biased by resistors R-128 and R-129 as powered by voltage $V_A$. The transistor Q-122 responds to the signal as presented by pin 2 of microcomputer 10.

When synchronous detector 70 is presented with a signal from the collector of Q-122 such that a signal from the four pole bandpass filter 60 is passed through the phase detector 70, the signal is integrated in integrator 80.

In its steady state condition, the output of the integrator 80 is a DC signal. The steady state condition is only perturbed by the calibration signals. The integrator is of conventional design and employs an operational amplifier with an input resistor on the inverting input, a fixed voltage on the non-inverting input and a feedback capacitor C-134 between the output of the operational amplifier U-103c to the inverting input at the juncture of the input resistor R-143.

The output of the integrator 80 is a DC signal which is fed through resistor R-145 to the non-inverting input of the summing amplifier 90. The summing amplifier 90 consists of a operational amplifier U-101b powered by $V_A$. The output of the integrator 80 is presented to the non-inverting input of U-101b and the output of U-101b is fed back to the non-inverting input of the U-101b. The output of the summing amplifier 90 is fed back to resistors R-148 and R-149 in multiplexer 50. This has the effect of diminishing the output of the four pole bandpass filter 60 due to the cancelling of the flux-gate signals. This provides stability to the system.

The subject invention employs procedures and hardware to design accuracy into this control system. These techniques and structure involve a ranging circuit, a simplified calibration technique, and a directional variance procedure.

The ranging circuit 100 exists to put a designated current through the east/west and north/south sense coils of flux-gate 42. The ranging circuit 100 brings the compass voltage into a range which can be handled by a software method incorporated into the microcomputer 10. The ranging circuit 100 affects each reading taken by the compass control circuit.

The ranging circuit 100 is also in operation during a simplified calibration procedure employed by the operator of the vehicle to calibrate the compass. A quick ranging procedure incorporated into microcomputer 10 facilitates the calibration.

A directional variance setting procedure is also provided to allow the operator of the vehicle to correct the direction reading of the compass for directional variance readings due to the particular location that the vehicle will be operating in. In other words, since the magnetic north pole does not coincide with the earth's axis of rotation, a variance will be noticed between true north and magnetic north. This is also known as magnetic deviation. A procedure is provided to correct for this deviation, store the correction and automatically perform the correction. The directional variance setting procedure is designed to be performed after every calibration. Thereafter, the correction is done automatically by the microcomputer and affects each direction reading.

Returning now to the urging circuit 100, its purpose is to bring the compass voltage on pin 10 of microcomputer 10 to range that the software in microcomputer 10 can handle. That is, the ranging circuit 100 allows the system to handle very large, stray magnetic fields. The ranging circuit 100 is used for both the north/south and east/west directions. It is also used in the calibration of the compass.

During the calibration of the compass, magnetic field strength information is picked up from integrator 80. The microcomputer 10 analyzes this information to determine whether an adjustment is needed.

Figure 10:
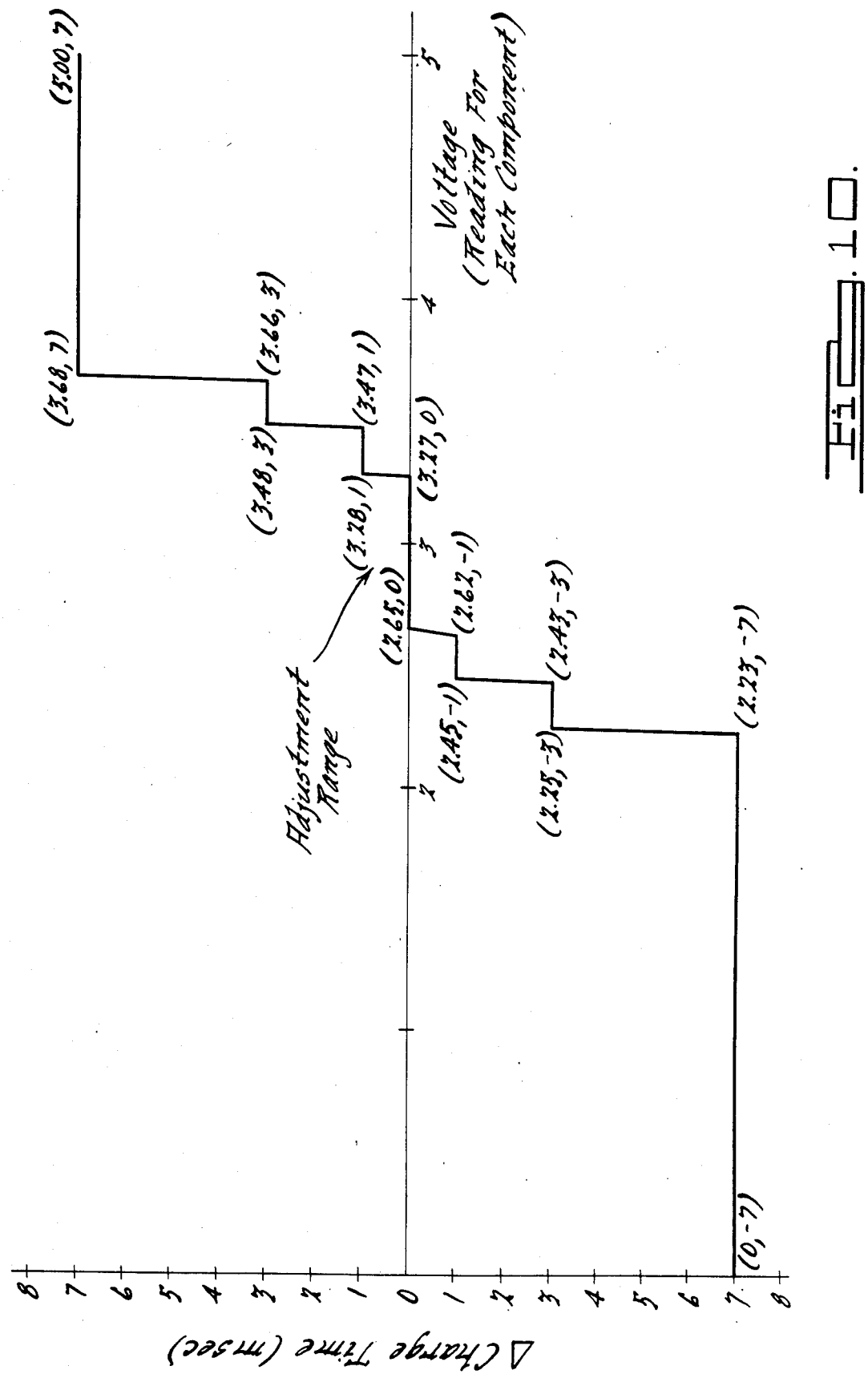
FIG. 10 is a graph showing the feedback for quick ranging.

The need for an adjustment is determined based on data stored in a look-up table in the memory of microcomputer 10. The same table is used for each directional component north/south and east/west. In each case the look-up table follows the general pattern as illustrated in FIG. 10 which shows the feedback in the quick ranging scheme further described below.

In the ranging circuit 100, capacitor C-160 is first discharged to some voltage close to ground. It is connected to the non-inverting input of operational amplifier U-103d and ground.

The voltage on capacitor C-160 is shorted to ground through gate switch U-102d, resistor R-161 and pin 15 of the microcomputer 10. (In this case, the switch U-102d is closed.) Capacitor C-160 is then charged from the voltage supply through transistor Q-160 as controlled from pins 15 and 17 of microcomputer 10 and biased by resistors R-164 and R-165, and powered by voltage $V_A$. The gate switch U-102d is in series with resistor R-161 with resistor R-161 being connected to the juncture of the non-inverting input of operational amplifier of U-103d and capacitor C-160.

Initially, pin 15 of the microcomputer 10 is pulled high to five volts. Capacitor C-160 starts to charge through the gate switch U-102d and resistor R-161. When the voltage from output A, presented to pin 10 of the microcomputer 10 is within the calibration range (2.65-3.27 volts), gate switch U-102d is opened and pin 15 of the microcomputer 10 is put into a high impedance state. During calibration, the charge time from when pin 15 is pulled high until the time when the gate switch U-102d is opened is then measured and stored by the microcomputer 10. This charge time will be used whenever this directional channel (north/south or east/west) is measured in order to charge capacitor C-160 for the same charge time. This is done by controlling gate switch U-102d for the stored charge time associated with each magnetic component.

The voltage across capacitor C-160 is held constant because switch U-102d is open. The voltage at the output of the operational amplifier U-103d is also held constant which is the voltage that is fed through into the compass circuit at the non-inverting input of U-101b and is augmented by biasing branch with resistor R-166 and voltage $V_{CC}$. Negative feedback to the operational amplifier U-103d is supplied by resistor R-162 and R-163, both being connected to the inverting input of the operational amplifier. R-162 being connected at its other end to the output of U-103d and resistor R-163 being connected at its other end to ground.

There are two channels that possibly need to be adjusted: a north/south and an east/west channel. The above steps are repeated for each channel. Thereafter, the microcomputer 10 uses the stored charge times every time a direction reading is taken.

During calibration, if the voltage at output A, which is presented to pin 10 of microcomputer 10, is not within the calibration range of 2.65-3.27 volts, the microcomputer 10 uses a quick ranging procedure graphically shown in FIG. 10 to quickly bring the voltage to the calibration range. The procedure is more fully explained in conjunction with the FIG. 5a and FIG. 5b below.

The quick ranging procedure is used during calibration by the microcomputer 10 to vary the charge time on capacitor C-160 in a fast manner to eliminate long delays between the stages of the calibration of the vehicle. This is accomplished by means of negative feedback in the ranging circuit 100 and by means of controlling the charge time on capacitor C-160 through the microcomputer 10. This is accomplished by using ranges which depend on how far out of balance the ranging circuit detects the output voltage from the integrator 80. For example, referring to FIG. 10, if the voltage level sensed by the microcomputer at pin 10 is between 0 and 2.23 volts, the charge time is reduced by 7 milliseconds. Similarly, the charge time is adjusted to the ranges as shown on FIG. 10 depending on the amount of voltage sensed at pin 10 by the microcomputer 10.

Once the voltage at pin 10 is found to be between 2.65 and 3.27 volts, the system is in calibration and the charge time deviation is reduced to 0. Therefore, the charge time on capacitor C160 which allowed the voltage at output A to fall between 2.65 and 3.27 volts is stored for that directional component. The stored value for each component represents the charge time which will be used by ranging circuit 100 at every reading of that particular directional channel. It is partially in this way that the compass is adjusted or compensated to correct for stray magnetic fields and ferromagentic material near to the compass.

Figure 3:
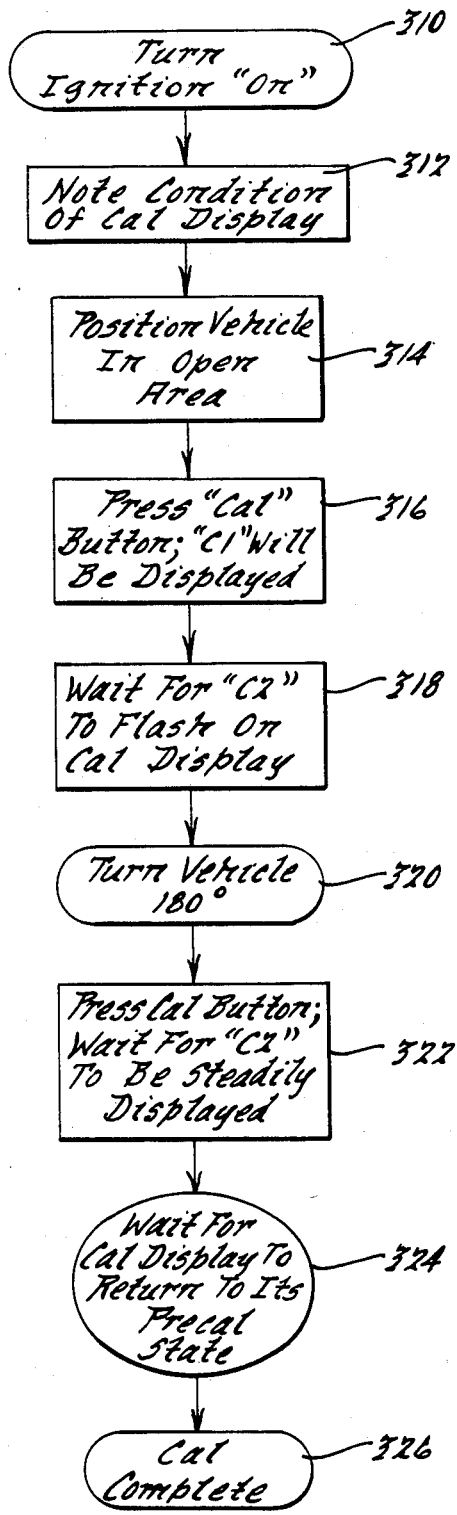
FIG. 3 is a flowchart for the compass calibration.

Referring now to FIG. 3, the compass calibration operator's procedure is outlined. It is activated by pushing a button on the input to microcomputer 10.

The operator must begin by turning on the ignition in block 310 and noting the condition of the calibration display in block 312. Next, the operator must position the vehicle in an open area—distant from large structures and allow a clearance for an 180 degree turn. This is called out in block 314.

Now the operator must press the "CAL" button which engages switch M-224 as shown on FIG. 2a and FIG. 2b. As described in block 316, the "C1" will be displayed on the calibration display. This indicates that the first half of the calibration procedure is operating. The operator must now wait for the "C2" to begin flashing on the calibration display indicating that the second half of the calibration procedure is ready to be done. This is called out in block 318. At this point the operator must turn the vehicle 180 degrees as spelled out in block 320.

The next step is to press the calibration button; "C2" will be displayed on the calibration display; this is shown in block 322. Waiting for the calibration display to return to its pre-calibration state is next and is shown in block 324. When the calibration display returns to its pre-calibration state, the calibration procedure is complete as shown in block 326.

It is to be noted that the calibration display is either a separate display for calibration purposes only or is a display normally used for another purpose, but loaned to the compass during the calibration period. Typically, the display is loaned for the calibration procedure and, under normal circumstances, displays temperature or some other variable.

Turning now to FIG. 4, a flowchart for setting the compass variance is presented. Once again, this is a procedure for the operator to use. In this procedure, a variance is specified between true north and magnetic north. This is needed since the magnetic north pole does not coincide with the earth's axis of rotation. This procedure is designed to be performed after every calibration.

As in the calibration procedure, the ignition must be turned on and this is called out in block 330. Then in block 332, the vehicle must be pointed in the true north position.

Next, in block 334, the variance button must be pressed. This results in switch M-225 being closed. Lastly, in block 336, the compass letters will blink once to indicate that the variance is accepted and then the compass will display north.

Figure 5A:
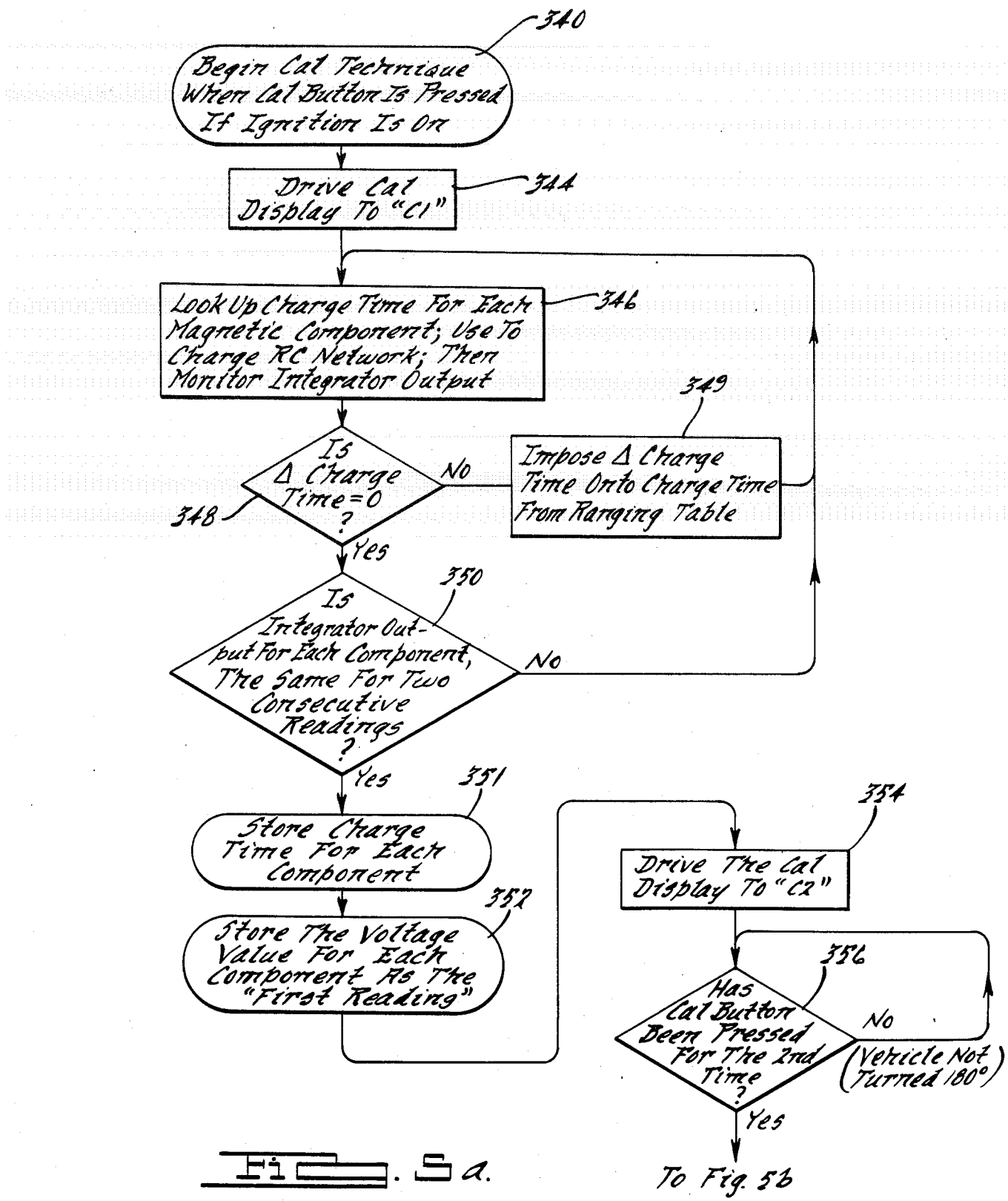
FIG. 5a is the flowchart of the calibration/ranging procedure.

The software calibration procedure for the electronic compass is presented in the flowchart shown in FIG. 5a and FIG. 5b. The procedure begins in block 340 when the operator of the vehicle presses the calibration button. Depression of this button energizes the switch M-224 in FIG. 2a and FIG. 2b. If the ignition is not on, the procedure is aborted by the loss of power to the microcomputer 10. If the ignition is on, the procedure falls through to block 344 and instructs the calibration display to display the figures (C1) indicating that the first half of the calibration procedure is operating. The procedure then falls through to block 346 to look up the charge time of capacitor C-160 in memory corresponding to the magnetic component voltage at the integrator 80 output. The table is presented in graph form as FIG. 10. If the charge time does not place the output voltage of the integrator 80 in a predetermined range, the delta charge time is not zero on block 348, and the system is out of range. For the particular compass control circuitry described in this invention, the range is between 2.65 and 3.27 volts. If the output voltage of the integrator 80 for each component is not within the range, the procedure imposes a delta charge time in block 349 according to the graph in FIG. 10 and eturns to block 346. If, however, the output voltage of the integrator 80 is within the required range, the procedure falls through to block 350 to check to see if the output of the integrator 80 is the same for two consecutive readings.

The procedure waits until the voltage of the integrator 80 for each component is the same for two consecutive readings by returning to block 346. If the output voltage of the integrator 80 for each component is the same for two consecutive readings as checked in block 350, the procedure falls through to blocks 351 and 352 to store the charge times and voltage values for each of the components (and label them as the "first reading"). The purpose of this wait is to allow the system time to settle on a number. This is very short, but necessary due to hardware and software integrators.

Next, the procedure instructs the calibration display to flash the figures "C2", indicating that the second half of the calibration procedure is ready to be done. This is done in block 354.

Next, the vehicle must be turned 180 degrees by the operator and the calibration button must be pressed by the operator for the second time. Therefore, the procedure watches for the depression of the calibration button in block 356. If this does not occur, the procedure waits at block 356 until the button is depressed. If the button has been depressed for the second time, the procedure falls through to block 358 and uses the charge times for each magnetic component as stored in block 351. The procedure falls through to block 362 to make another check of the output of the integrator 80 for each magnetic component to wait until the reading is the same for two consecutive sample times.

If the output voltage of the integrator 80 for each magnetic component is the same for two consecutive readings, the procedure falls through to block 364 to store the voltage value for each magnetic component (and label it as the "second reading").

Then, the procedure computes the calibration offsets in block 366 for each magnetic component using this formula:

the offset = (first reading + second reading) ÷ 2

The procedure next proceeds to block 368 and stores the calibration offsets in block 366 for each magnetic component. Then the procedure in 370 will use the offsets in the formulas to compute the compass headings. The compass headings and degrees are computed using the following formula:

Heading = arctangent ((N/S reading − N/S offset) ÷ (E/W reading − E/W offset))

The N/S reading and E/W reading are filtered values. This is explained below in conjunction with the digital filtering feature.

Figure 6:
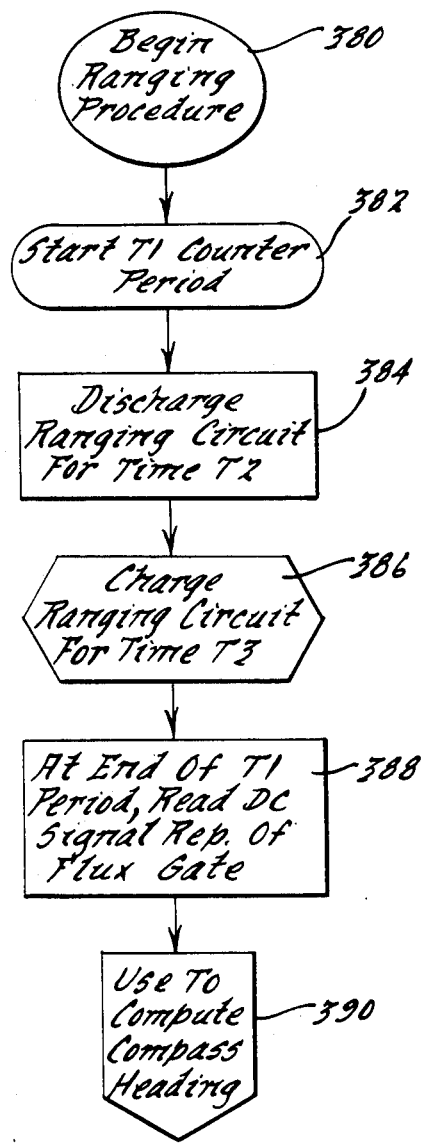
FIG. 6 is the flowchart of the auto-ranging procedure.

Proceeding now to FIG. 6, the software ranging procedure for the electronic compass is described. This procedure is used by microcomputer 10 using the charge times determined in the procedure outlined in FIG. 5a and FIG. 5b. The procedure begins in block 380 and proceeds to block 382 to start a 500 millisecond counter period which we will call T1.

The procedure then falls through to block 384 to discharge the ranging circuit 100 for a time period of 180 milliseconds which we will call time T2.

Next, the procedure falls through to block 386 to charge the ranging circuit 100 for a time period T3. Time T3 is a charge time as determined in the software calibration procedure described in FIG. 5a and FIG. 5b. The range of the charge times that are developed in the procedure outlined in FIG. 5a and FIG. 5b are in the range of 0 to 100 milliseconds.

The procedure next falls through to block 388 and at the end of the time period T1 (500 milliseconds), the DC signal representative of the flux-gate output is read from pin 10 of the microprocessor 10. This is the filtered, integrated and summed output of the flux-gate 42. Next, the procedure falls through to block 390 and uses the DC signal to compute the compass heading. The output of the integrator 80 is either the N/S or E/W component of the magnetic field present at the flux-gate. This output is used in the compass heading formula as computed by the microcomputer 10.

Referring now to FIG. 7, signal diagrams are shown which will help explain how the software and hardware are interrelated. Curve 396 is the output of the integrator 80. Ths signal 398 is the ranging voltage signal taken between resistor R-162 and operation amplifier U-103. The third signal 400 is the ranging control signal and is monitored at pin 17 of the microcomputer 10. The fourth trace is the integrator multiplexer signal taken from pin 21 of the microcomputer 10. The left half of these traces show the E/W flux sensor selection and the right half of the traces show the N/S sensor selection.

Also of interest is FIG. 8 which shows the synchronous detector signals and the coil driver signals. The synchronous detector signal is shown as 404 which is monitored at pin 2 of microcomputer 10. Also shown is the coil driver signal 406 monitored at pin 3 of the microcomputer 10. The coil driver signal 406 is a 500 Hz. signal which excites the flux-gate 42. The synchronous detector signal 404 is a 1,000 Hz. signal which provides a window for the flux-gate output. The phase relationship between the synchronous detector signal 404 and the coil driver signal is that the synchronous detector signal goes high 250 microseconds after the coil driver signal goes high.

The software which works with the electronic compass interacts with the hardware circuitry and the flux-gate transducers, as well as other temperature sensors and switches throughout the system. There are five basic functions that the software provides. They are: (1) reading and filtering magnetic field components; (2) computing compass heading; (3) multiplexing; (4) ranging; and (5) calibration and quick ranging.

Referring now to FIG. 7 and more specifically to trace 396, the integrator 80 output signal, the reading and filtering of the magnetic field components takes place. Every half second the software reads the value of the magnetic field component which was set up in the previous half second. This will be either the N/S component or the E/W component. This is the analog to digital converter (A/D) value which is read at pin 10 of microcomputer 10. It is then passed through a digital filter which is equivalent to an R/C filter with a time constant to three seconds. This all happens at point "a" on curve 396. Point "a" occurs just prior to each reference transition (point "c") on curve 402. At point "a", the voltage represented by curve 396 has stabilized.

Figure 9:
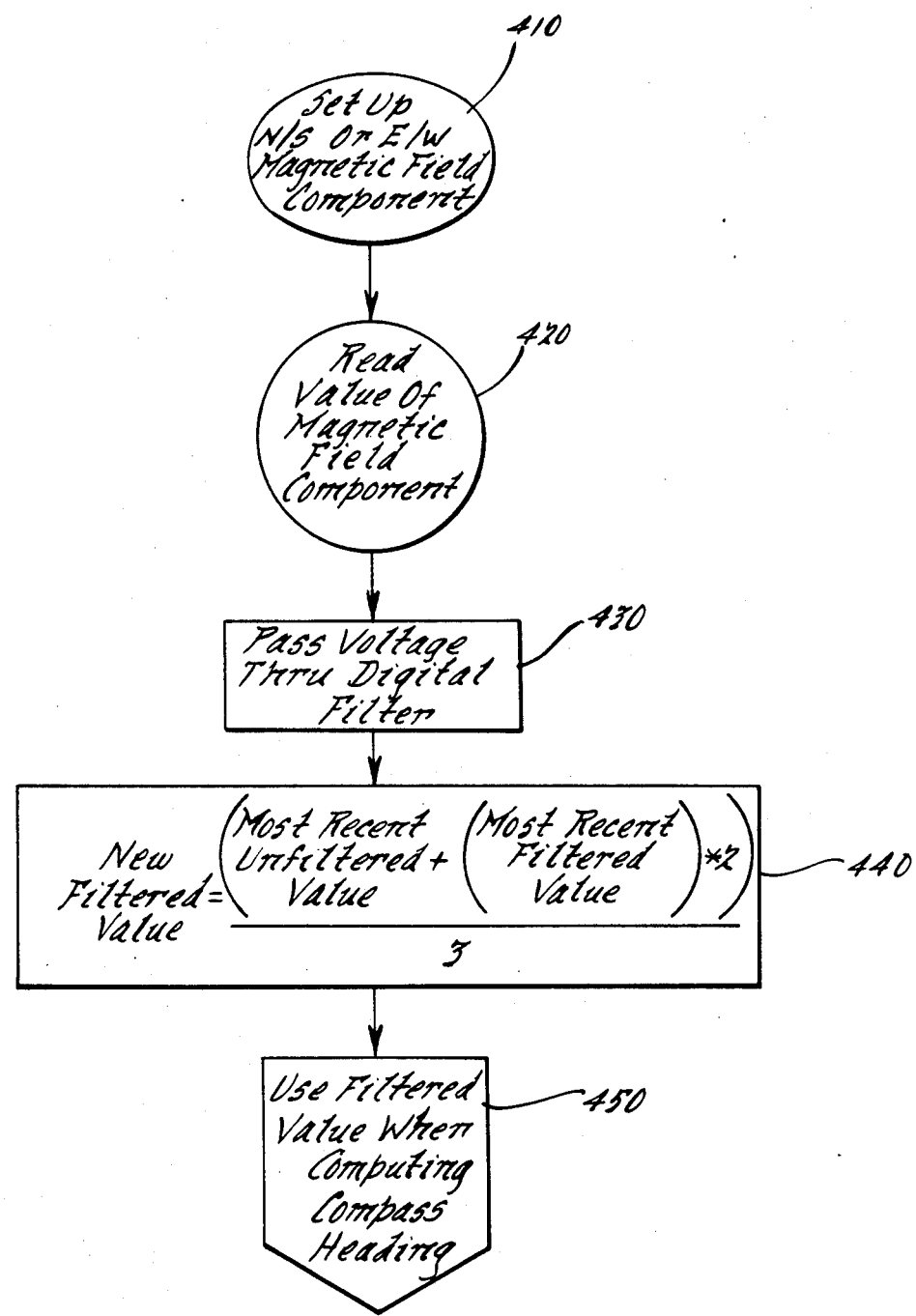
FIG. 9 is a flowchart of the reading and filtering of the magnetic field components.

Referring now to FIG. 9, the reading and filtering of the magnetic field components is diagrammatically illustrated. First, in block 410, the magnetic field components, either N/S or E/W are set up. This means that the multiplexer switched charge voltage is applied and allowed to settle.

Next, in block 420, the value of the magnetic field component is read and then the voltage is passed through to a digital filter in block 430 to smooth out the magnetic field component signals. The new filtered value is computed to be:

(most recent unfiltered value+(most recent filtered value*2))÷3 in block 440.

This is used as the reading in the directional computation in block 450.

The computing of the compass heading is as previously described. The computation occurs at point "b", which occurs immediately after point "a" on curve 396. However, the arctangent computation is not straight forward as some microprocessors do not have an integer multiply or integer divide instruction. The method used in the subject invention was to approximate the arctangent function by means of two small tables which are linear interpolations using scaled integer arithmetic. One table covers the arctangent values from zero to two and the other covers the values from two to 32. Any value over 32 is assigned an angle of 89 degrees. This method is accurate to an error of +1.0 and −0.5 degrees. This happens at point "b" of curve or trace 396 in FIG. 7.

The multiplexing feature calls for the software to alternately select each flux-gate sensing coil every half second. It does this by toggling the value of the port bit which controls pin 21. Additionally, it must remember which sensing coil is selected in order to use the correct ranging and calibration. This happens at each point "c" in trace 402 of FIG. 7. The effect of the multiplexer 50 is seen in the traces of FIG. 7 and FIG. 8.

Point "d" on curve 400 occurs immediately after the transition at each point "c" on curve 402. At point "d", the auto range voltage begins to discharge as shown in curve 398.

Point "e" on curve 400 represents the beginning of the charge onto capacitor C-160. This charging voltage is shown in curve 398 after the time of the point "e" transition.

The use of the multiplexed components minimizes the circuitry required and reduces the effect of gain on the circuit. This is done by emphasizing repeatability. Only one bandpass filter 60 is used. It is designed with conventional analog components for economy. If one filter were used for each magnetic component, the effects of temperature on each filter could produce unpredictable results. With one filter multiplexed to use with both components, both component readings are affected by temperature (gain) changes and repeatability is predictable. When combined with the ranging cicuitry 100, the multiplexer 50 produces repeatable and fairly accurate results.

The ranging features of the subject invention occur in three stages: discharge, charge and hold; and can be seen in the traces in FIG. 7 for more clarity. Although repetitive, this explanation in conjunction with FIG. 7 will help understand the ranging features.

After the heading is computed and the flux-gate sensing coil is switched from the E/W coil to the N/S, the ranging sequence is started. The stages of the ranging begin with the discharging of capacitor C-160 by driving pins 15 and 17 of the microcomputer 10 to a low state. This condition is held for 180 milliseconds and starts at point "d" shown in FIG. 7.

C-160 is then charged in the next stage to a voltage established by the calibration (previously described in conjunction with FIG. 5a and FIG. 5b). This is done by holding pin 17 of the microcomputer to a low state while driving pin 15 of the microcomputer to a high state. This condition is held for a length of time determined by the calibration sequence, typically 20 to 100 milliseconds and starts at point "e" shown in FIG. 7.

The whole sequence calls for the feedback circuit to stabilize for from 300 to 220 milliseconds before a field component is read. This is done by driving pin 17 of the microcomputer to a high state when pin 15 can be in any state. This starts at each point "f" in curve 398 of FIG. 7. The voltage levels at each point "f" are a function of the charge times for each magnetic component and, once calibrated, will remain the same for each component until re-calibrated.

While the present invention has been disclosed in connection with the preferred embodiment thereof, it should be understood that there may be other embodiments which fall within the spirit and scope of the invention and that the invention is susceptible to modification, variation and change without departing from the proper scope or fair meaning of the following claims.

I claim:

1. A multiplexed control circuit for an electronic compass including a microcomputer, a flux-gate, a flux-gate driver, a bandpass filter, a synchronous detector, an integrator, a summing amplifier, and a ranging circuit the multiplexed control circuit comprising:

a gate switch connected at its input to the flux-gate for each magnetic component to be measured;

a switching network, controlled by the microcomputer;

the gate switches commonly connected at their outputs to the serial connection of the bandpass filter, synchronous detector, integrator and summing amplifier;

the microcomputer sending signals to the switching network such that the gate switches for each magnetic component are controlled, alternately conducting, thereby alternately allowing the output of the flux-gate to pass through to the serial connection of the bandpass filter, synchronous detector, integrator and summing amplifier whereby the effects of gain and component tolerances on the control circuit is minimized.

* * * * *